United States Patent
Yamanoue et al.

(10) Patent No.: US 12,418,172 B2
(45) Date of Patent: Sep. 16, 2025

(54) VEHICLE POWER SUPPLY DEVICE

(71) Applicant: Imasen Electric Industrial Co., Ltd., Inuyama (JP)

(72) Inventors: Koichi Yamanoue, Inuyama (JP); Daisuke Makio, Inuyama (JP)

(73) Assignee: Imasen Electric Industrial Co., Ltd., Inuyama (JP)

( * ) Notice: Subject to any disclaimer, the term of this patent is extended or adjusted under 35 U.S.C. 154(b) by 0 days.

(21) Appl. No.: 18/838,467

(22) PCT Filed: Mar. 1, 2023

(86) PCT No.: PCT/JP2023/007456
§ 371 (c)(1),
(2) Date: Aug. 14, 2024

(87) PCT Pub. No.: WO2023/167211
PCT Pub. Date: Sep. 7, 2023

(65) Prior Publication Data
US 2025/0141214 A1    May 1, 2025

(30) Foreign Application Priority Data

Mar. 2, 2022 (JP) ................................ 2022-031982

(51) Int. Cl.
*H02H 7/22* (2006.01)
*B60L 58/22* (2019.01)
(Continued)

(52) U.S. Cl.
CPC ............... *H02H 7/22* (2013.01); *B60L 58/22* (2019.02); *H01M 10/425* (2013.01);
(Continued)

(58) Field of Classification Search
CPC ....... H02H 7/22; B60L 58/22; B60L 2210/10; B60L 2210/40; B60L 2240/547;
(Continued)

(56) References Cited

U.S. PATENT DOCUMENTS

| 2022/0181902 | A1 | 6/2022 | Takahashi et al. |
| 2023/0010365 | A1* | 1/2023 | Makio .................. B60L 3/0046 |
| 2023/0391201 | A1* | 12/2023 | Makio ....................... H02H 7/18 |

FOREIGN PATENT DOCUMENTS

| CN | 113710545 A | 11/2021 |
| CN | 114788123 A | 7/2022 |

(Continued)

OTHER PUBLICATIONS

International Application No. PCT/JP2023/007456, International Search Report, Written Opinion, May 9, 2023, 12 pages.

*Primary Examiner* — Rexford N Barnie
*Assistant Examiner* — Swarna N Chowdhuri

(57) ABSTRACT

A vehicle power supply device comprises: a first power storage element group having multiple power storage elements connected in series; a second power storage element group connected in series to the positive pole side of the first power storage element group forming a high-voltage DC power supply by being combined with the first power storage element group; an active balancer; a first switching means and second switching means disposed between the first power storage element group and a low-voltage load; a control means; an interrupting means for interrupting power from the high voltage DC power supply; and a power leakage detection means. The control means determines a signal transmitted from the power leakage detection means during a dead time period in which the first and second switching means are OFF, and interrupts power supplied to the load for a prescribed period if the leakage current has reached a prescribed level.

7 Claims, 6 Drawing Sheets

(51) Int. Cl.
    *H01M 10/42*          (2006.01)
    *H01M 10/46*          (2006.01)
    *H02J 1/08*            (2006.01)

(52) U.S. Cl.
    CPC ............. *H01M 10/46* (2013.01); *H02J 1/082* (2020.01); *B60L 2210/10* (2013.01); *H01M 2220/20* (2013.01)

(58) Field of Classification Search
    CPC ............ B60L 2240/549; B60L 3/0069; H01M 10/425; H01M 10/46; H02J 1/082
    USPC .......................................................... 307/9.1
    See application file for complete search history.

(56)              References Cited

FOREIGN PATENT DOCUMENTS

| | | |
|---|---|---|
| EP | 4005878 A1 | 6/2022 |
| EP | 4096040 A1 | 11/2022 |
| JP | 2021-23018 A | 2/2021 |
| JP | 2021-114847 A | 8/2021 |

\* cited by examiner

VEHICLE POWER SUPPLY DEVICE

CROSS-REFERENCE TO RELATED APPLICATIONS

This application is a national stage of International Patent Application No. PCT/JP2023/007456, filed Mar. 1, 2023; which claims priority to Japanese Patent Application No. 2022-031982, filed Mar. 2, 2022; the entire contents of each of which is incorporated by reference herein.

TECHNICAL FIELD

The present technology relates to a vehicle power supply device. Particularly, the present technology relates to a vehicle power supply device that supplies power to a plurality of loads that operate at different voltages, the vehicle power supply device being capable of implementing reliable electric shock preventative measures for a user by a simple configuration.

BACKGROUND

Conventionally, electric circuits of automobiles were divided into two kinds, namely circuits that supply low-voltage power from lead storage batteries having a voltage of 12 V or 24 V, and circuits that supply high-voltage power from driving secondary batteries having a voltage of 300 V to 400 V. Lead storage batteries are heavy, and the manufacture and disposal of such batteries in themselves have a high environmental impact. Furthermore, there are cases when recent electric vehicles and hybrid vehicles require power supply at elevated voltages. Therefore, secondary battery systems that are capable of providing different voltages as a power supply for a vehicle using a single power supply are being developed.

In secondary battery systems, secondary batteries in which a plurality of power storage elements are connected in series are widely used. Such secondary batteries are capable of obtaining a high-voltage output voltage and to efficiently supply power by increasing the number of power storage elements. Meanwhile, vehicle power supplies require rigorous electric shock preventative measures. With regards to power systems in which the operating voltage is a DC voltage of 60 V or more in particular, safety measures are essential.

The inventors have previously invented a vehicle power supply device that obtains a low-voltage power supply from a high-voltage power supply via a step-down means, wherein an electric shock to a human body can be prevented without the use of an insulating means such as a transformer. This invention is disclosed in Japanese Unexamined Patent Publication No. 2021-114847 (hereinafter referred to as "Patent Document 1"). The basic configuration of the vehicle power supply device of Patent Document 1 is illustrated in FIG. 5. The vehicle power supply device supplies power from a high-voltage power supply 600 that is constituted by a plurality of power storage elements to an electric load 300 that operates at 12 V, and to a high-voltage load device 400. The vehicle power supply device includes a plurality of switching means that connect a portion of the power storage elements of the high-voltage power supply 600 to the electric load 300, and supplies power having a prescribed voltage to the electric load while selectively switching the switching means in a period of about 100 usec. The voltage balance between the power storage elements is controlled by controlling the connection time of the switching means. Further, the vehicle power supply device of Patent Document 1 includes a leakage detection means 100 that detects a leakage current between the high-voltage power supply and a ground potential. The leakage detection means 100 detects the presence of a leakage during a dead time period in which all the switching means are turned OFF. The leakage detection means measures, for example, a leakage current between the high-voltage power supply and a ground electrode. A control means determines that a leakage has occurred when the leakage current detected by the leakage current detection means is greater than 0 ampere, and prevents an electric shock by prohibiting subsequent connection of the switching means or by turning OFF cutoff means 500, 501.

The inventors have also invented a high-voltage power supply characterized in that, in a secondary battery in which a plurality of batteries are connected in series, output terminals that are provided between the batteries are grounded. This invention is disclosed in Japanese Unexamined Patent Publication No. 2020-199925 (hereinafter referred to as "Patent Document 2"). The basic configuration of the high-voltage power supply of Patent Document 2 is illustrated in FIG. 6. The high-voltage power supply 124 includes a plurality of batteries 111 that include a plurality of power storage elements and are connected in series. Output terminals between the batteries 111 are connected to a ground 105 of a vehicle body, and constitute a ground potential. This reduces the maximum potential difference between the high-voltage power supply 124 and the ground 105, which eliminates the need for insulation of the vehicle body even in a case where power is supplied to a high-voltage load device 103. The high-voltage power supply 124 also includes a balancer 132 that is connected in parallel to all of the batteries 111 and forms a bypass circuit, whereby the charge/discharge states of the plurality of batteries 111 are dynamically controlled.

When common power storage elements having a voltage of 3 V are applied to the vehicle power supply device of Patent Document 1, 100 power storage elements and 50 switching elements are necessary in order to supply power to a load device that is rated for a high voltage of 300 V. Providing many switching elements leads to a higher cost of the device as a whole, and complexity of control. Meanwhile, in the high-voltage power supply of Patent Document 2, when supplying power to a load device that is rated for a voltage of 300 V, the potential difference between the high-voltage power supply 124 and the ground 105 becomes at least 150 V. Therefore, there is a need for electric shock preventative measures like those of the conventional art.

SUMMARY OF THE INVENTION

Problems to be Solved by the Invention

In vehicle power supply systems, there is a need to provide reliable insulation between the various electric circuits and the vehicle body, which a user may touch. However, in the case of a power supply system that includes a plurality of voltage systems, there is a tendency of the device configuration for performing voltage control and insulation to become large and expensive.

The present technology was made in view of the above problem, addressing the problem of providing a vehicle power supply device that is capable of supplying a plurality of voltages and of implementing reliable electric shock preventative measures.

Means for Solving the Problem

The present technology relates to a vehicle power supply device that supplies power to a low-voltage load and a high-voltage load that is driven by a higher voltage than that of the low-voltage load. The vehicle power supply device according to the present technology includes: a first power storage element group in which a plurality of power storage elements are connected in series and a DC power supply having a prescribed voltage is obtained; a second power storage element group that is constituted by a plurality of power storage elements that are connected in series, the second power storage element group being connected in series to a positive pole side of the first power storage element group and constituting a high-voltage DC power supply by being combined with the first power storage element group; an active balancer that is positioned between the first power storage element group and the second power storage element group; an interrupting means that interrupts power from the high-voltage DC power supply; a control means; and a power leakage detection means. The control means performs control to obtain a prescribed low voltage by controlling a first switching means and a second switching means, performs control to substantially equalize the capacities of all the power storage elements by controlling the active balancer, and performs control to switch the interrupting means. The power leakage detection means detects a leakage current between the high-voltage DC power supply and a ground potential, and transmits a signal to the control means. The control means determines the signal transmitted from the power leakage detection means during a dead time period in which the first switching means and the second switching means are OFF, and interrupts power supplied to either one or both of the low-voltage load and the high-voltage load for a prescribed period in case the leakage current has reached a prescribed level.

In the vehicle power supply device according to the present technology, the active balancer may be connected to three points that are the negative pole side of the first power storage element group, the positive pole side of the second power storage element group, and an output terminal that is provided between the first power storage element group and the second power storage element group.

The control means of the vehicle power supply device according to the present technology may fix the interrupting means in an OFF state when the leakage current has reached a prescribed level.

The control means of the vehicle power supply device according to the present technology may also, when the leakage current has reached a prescribed level, repeat an operation of holding the interrupting means in the OFF state for a prescribed period, and then turning the interrupting means ON again.

The control means of the vehicle power supply device according to the present technology may control the switching means so that the maximum value of a product of a period in which the first and second switching means and the low-voltage load are connected and a power leakage detection value of the power leakage detection means becomes 0.003 ampere×1 second or less.

The control means of the vehicle power supply device according to the present technology may prohibit connection of the first switching means and the second switching means when the leakage current has reached a prescribed level.

In the vehicle power supply device according to the present technology, a current value that constitutes a reference of the leakage current may be set to 0 ampere. The control means preferably interrupts power supplied to either one or both of the low-voltage load and the high-voltage load in case the leakage current is greater than 0 ampere.

Effects of the Invention

The vehicle power supply device according to the present technology makes it possible to provide power at both a high voltage and a low voltage. The low voltage is supplied from a first power storage element group via a first switching means and a second switching means. There is no need for a DC-DC converter and a large number of switching elements, which were necessary in order to obtain a low voltage from a high-voltage power supply in the conventional art, and therefore, it is possible to simplify the configuration of the device as a whole and make the device more inexpensive than the conventional art.

The withstand voltage of the first switching means and the second switching means of the vehicle power supply device according to the present technology need only be compatible with the voltage that is output by the first power storage element group, and switching means having a lower voltage compatibility may be applied. Therefore, the configuration of the device as a whole can be simplified, and the device can be made at a lower cost.

Meanwhile, in the vehicle power supply device according to the present technology, an electric shock prevention unit of the control means determines the signal transmitted from the power leakage detection means during a dead time period in which the first switching means and the second switching means are OFF, and interrupts power supplied to either one or both of the low-voltage load and the high-voltage load for a prescribed period in case the leakage current has reached a prescribed level, thereby implementing reliable electric shock preventative measures and making it possible to ensure safety.

Particularly, the control means outputs a command to turn the interrupting means OFF at an appropriate timing and period, and the interrupting means interrupts the current by the command. Therefore, the supply of power from the high-voltage DC power supply is stopped, and reliable electric shock preventative measures can be implemented around the high-voltage system and the high-voltage load.

Alternatively, by prohibiting connection of the first switching means and the second switching means by a command that is output from the control means, whereby the switching means are turned OFF, supply of the low-voltage power is stopped, and reliable electric shock preventative measures can be implemented around the low-voltage system and the low-voltage load.

DETAILED DESCRIPTION

Figure 1:
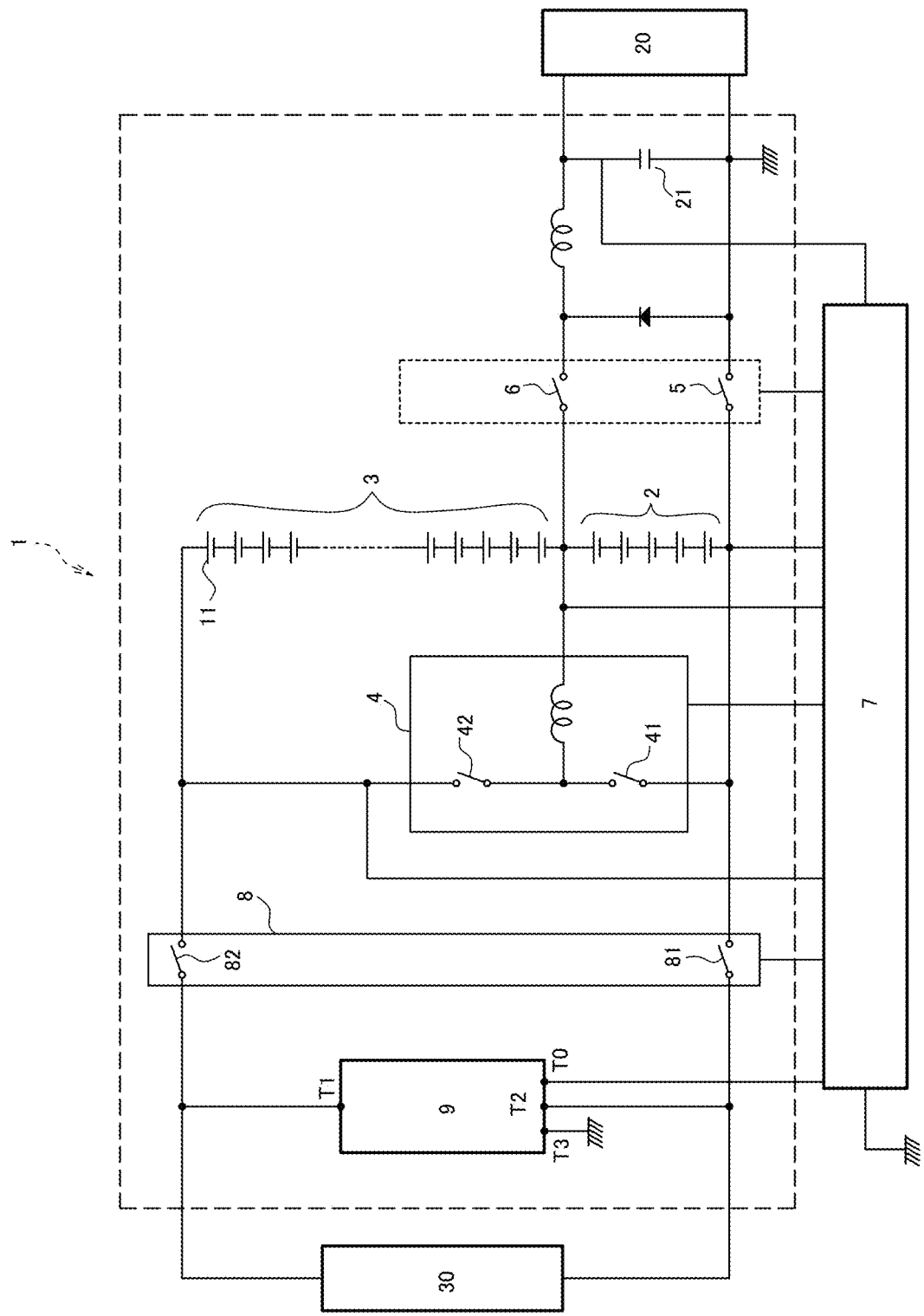
FIG. 1 is a block diagram that schematically illustrates a connection state of a vehicle power supply device according to the present technology and a plurality of loads.

An embodiment of a vehicle power supply device according to the present technology is described below with reference to the drawings. FIG. 1 is a block diagram that schematically illustrates an example of a vehicle power supply device 1 according to an embodiment of the present technology. The vehicle power supply device 1 according to the present embodiment supplies power to a low-voltage load 20, and to a high-voltage load 30.

The vehicle power supply device 1 includes a first power storage element group 2, a second power storage element group 3, an active balancer 4, a first switching means 5, a second switching means 6, a control means 7, an interrupting means 8, and a power leakage detection means 9.

The first power storage element group 2 is a power storage element group that serves as a power supply for the low-voltage load 20. The first power storage element group 2 is constituted by a plurality of secondary batteries respectively capable of charging and discharging being connected in series. The power storage elements may be configured by battery cells 11 such as lithium-ion batteries or nickel-hydrogen batteries, and are charged by a power generation means installed in the vehicle, or by an external power supply.

The second power storage element group 3 is combined with the first power storage element group 2 to constitute a high-voltage power supply that serves as a power supply for the high-voltage load 30. The second power storage element group 3 is connected in series to the positive pole side of the first power storage element group 2. The power storage elements that constitute the second power storage element group 3 may be configured by the same secondary battery cells 11 as those of the power storage elements of the first power storage element group 2, such as lithium-ion batteries or nickel-hydrogen batteries. The second power storage element group 3 is also charged by a power generation means installed in the vehicle, or by an external power supply.

The first power storage element group 2 often has less remaining capacity than the second power storage element group 3 due to supplying power to the low-voltage load 20. The active balancer 4 is positioned between the first power storage element group 2 and the second power storage element group 3, and substantially equalizes the state of charge (SOC) of the power storage elements, that is to say the remaining capacity relative to the maximum capacity of each power storage element. The active balancer 4 may be connected to the three points of the negative pole side of the first power storage element group 2, the positive pole side of the second power storage element group 3, and an output terminal that is provided between the first power storage element group 2 and the second power storage element group 3.

The first switching means 5 and the second switching means 6 are arranged on wires for supplying power from the first power storage element group 2 to the low-voltage load 20, and when both the first switching means 5 and the second switching element 6 are ON, power is supplied to the low-voltage load 20. The ON and OFF timing of the first switching means 5 and the second switching means 6 is controlled by the control means 7.

In an embodiment, a capacitor 21 that is connected in parallel with the low-voltage load 20 is provided. During a period in which both the first switching means 5 and the second switching means 6 are turned OFF by the control means 7, the supply of power from the first power storage element group 2 to the low-voltage load 20 is instantaneously interrupted, and it is therefore possible that the electric load of the vehicle that is the low-voltage load 20 is instantaneously stopped. However, by providing the capacitor 21, power charged into the capacitor 21 continues to be supplied to the low-voltage load 20 even when the first switching means 5 and the second switching means 6 are turned OFF, whereby the voltage does not drop to 0 volts, and the drop in voltage can be kept slight.

The interrupting means 8 includes a first interrupting switch 81 and a second interrupting switch 82, and is positioned on the wires through which power is supplied to the high-voltage load 30 by the first power storage element group 2 and the second power storage element group 3. As illustrated in the upper portion of FIG. 3, the first interrupting switch 81 and the second interrupting switch 82 repeat, in a cycle TS, an operation of being turned ON for a period TS and being turned OFF for a certain period. During the period in which the first interrupting switch 81 and the second interrupting switch 82 are ON, the high-voltage power supply that is constituted by the first power storage element group 2 and the second power storage element group 3 is supplied to the high-voltage load 30, and during the period in which the first interrupting switch 81 and the second interrupting switch 82 are OFF, the high-voltage load 30 is cut off from the high-voltage power supply.

The power leakage detection means 9 is positioned between the high-voltage DC power supply and the high-voltage load 30. The power leakage detection means 9 has a terminal T1 that is connected to the positive pole side of the second power storage element group 3, and a terminal T2 that is connected to the negative pole side of the first power storage element group 2. The power leakage detection means 9 is also grounded to the vehicle body via a terminal T3, and is further communicably connected to the control means 7 via a terminal TO.

The control means 7 monitors and controls the entirety of the vehicle power supply device 1. In particular, the control means 7 controls the first switching means 5 and the second switching means 6 to obtain a prescribed low voltage, and cuts off power to the low-voltage load as needed when a power leakage has been detected. The control means 7 also controls the active balancer 4 so that the states of charge of all the power storage elements are substantially equalized. Further, the control means 7 controls switching of the interrupting means 8 on the basis of an output from the power leakage detection means 9.

The control means 7 controls the first switching means 5 and the second switching means 6 in a prescribed frequency and duty cycle. When both the first switching means 5 and the second switching means 6 are turned ON, power is supplied to the low-voltage load 20. By simultaneously switching the first switching means 5 and the second switching means 6, the control means 7 is able to output stabilized low-voltage power.

The control means 7 controls the active balancer 4 to control the charging state and the discharging state of the first power storage element group 2 and the second power storage element group 3. The active balancer 4 is connected to three points, namely the negative pole side of the first power storage element group 2, the positive pole side of the second power storage element group 3, and an output terminal that is provided between the first power storage element group 2 and the second power storage element group 3. The active balancer 4 includes a switching element 41 on the negative pole side of the first power storage element group 2, and a switching element 42 on the positive pole side of the second power storage element group 3. These switching elements 41, 42 are controlled to be turned ON and OFF in a duty cycle that corresponds to the number of power storage elements to supply power from the power generation means, whereby the states of charge of all the power storage elements during operation are substantially equalized.

Figure 2:
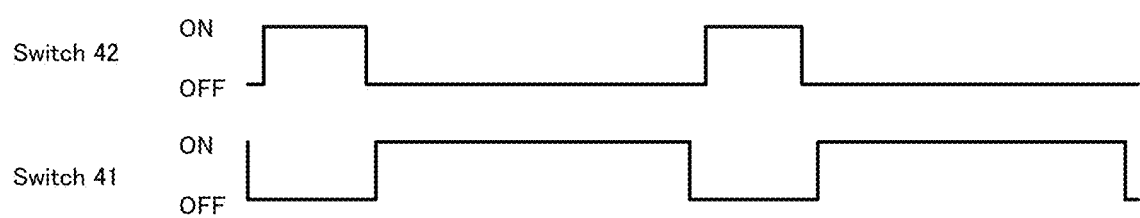
FIG. 2 schematically illustrates the details of control of a charge state by an active balancer.

As an example, the details of the charging/discharging control performed by the active balancer will be described in a case where the same type of power storage elements are used in the first power storage element group 2 and the second power storage element group 3, and the ratio of the number of power storage elements in the first power storage element group 2 and the second power storage element group 3 is 1:3. As illustrated in FIG. 2, by setting the period in which the switching element 41 is turned ON and the switching element 42 is turned OFF to be approximately three times the period in which the switching element 41 is turned OFF and the switching element 42 is turned ON, the time during which the first power storage element group 2 is charged can be made longer, and the states of charge of the first power storage element group 2 and the second power storage element group 3 can be substantially equalized. At this time, the active balancer 4 performs the same operation as a step-up/step-down chopper.

Further, the control means 7 determines a signal that is transmitted from the power leakage detection means 9 during a dead time period in which the first switching means 5 and the second switching means 6 are OFF, and interrupts power supplied to either or both of the low-voltage load 20 and the high-voltage load 30 for a prescribed period when the leakage current has reached a prescribed level. Detection of the leakage state by the control means 7 needs to be performed during the dead time period in which the first switching means 5 and the second switching means 6 are OFF. This is because when the first switching means 5 and the second switching means 6 are ON, the overall resistance value becomes low, and the detection accuracy of the leakage state becomes low.

Figure 3:
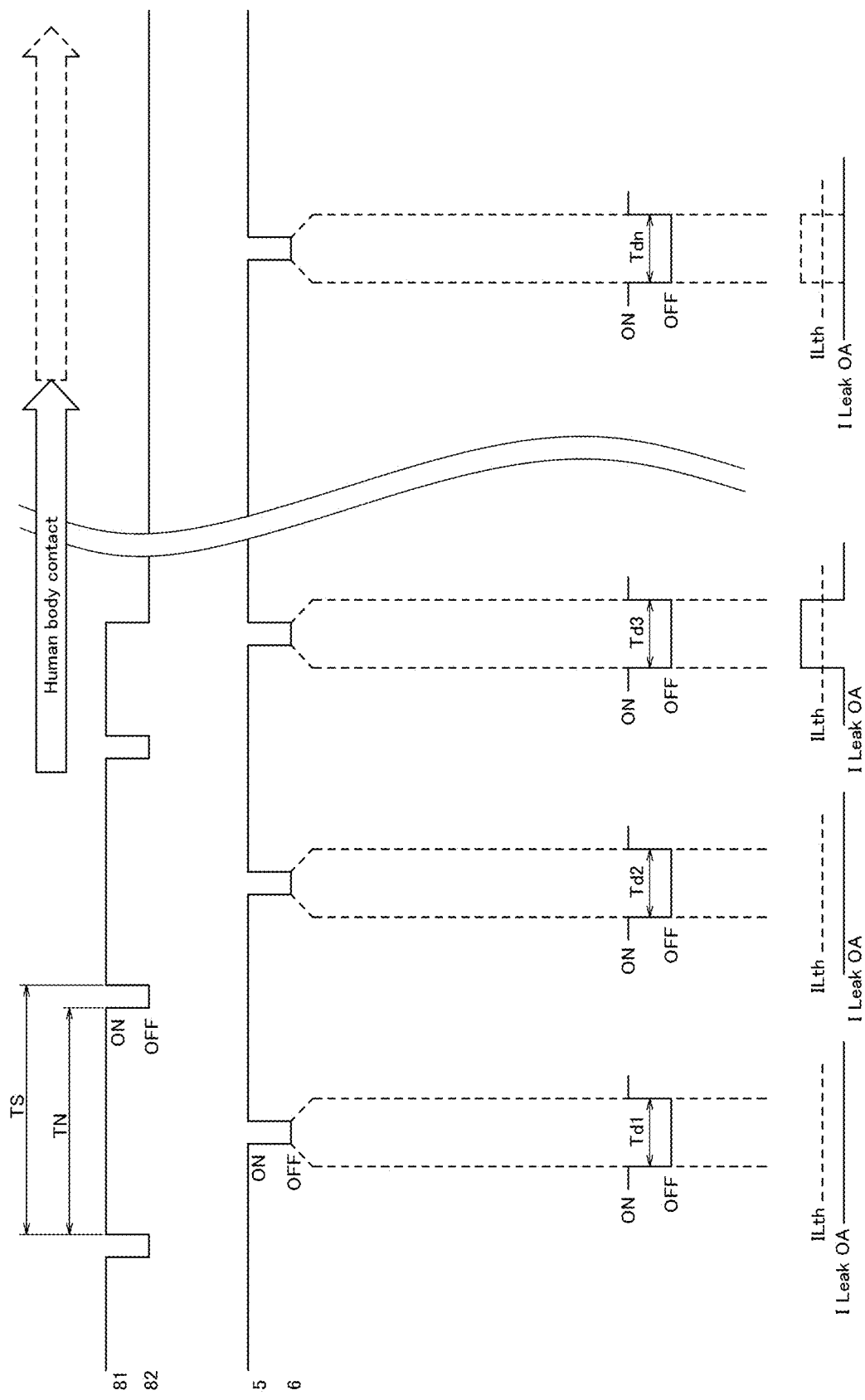
FIG. 3 describes an example of leakage detection in a vehicle power supply device according to an embodiment of the present technology.
Figure 4:
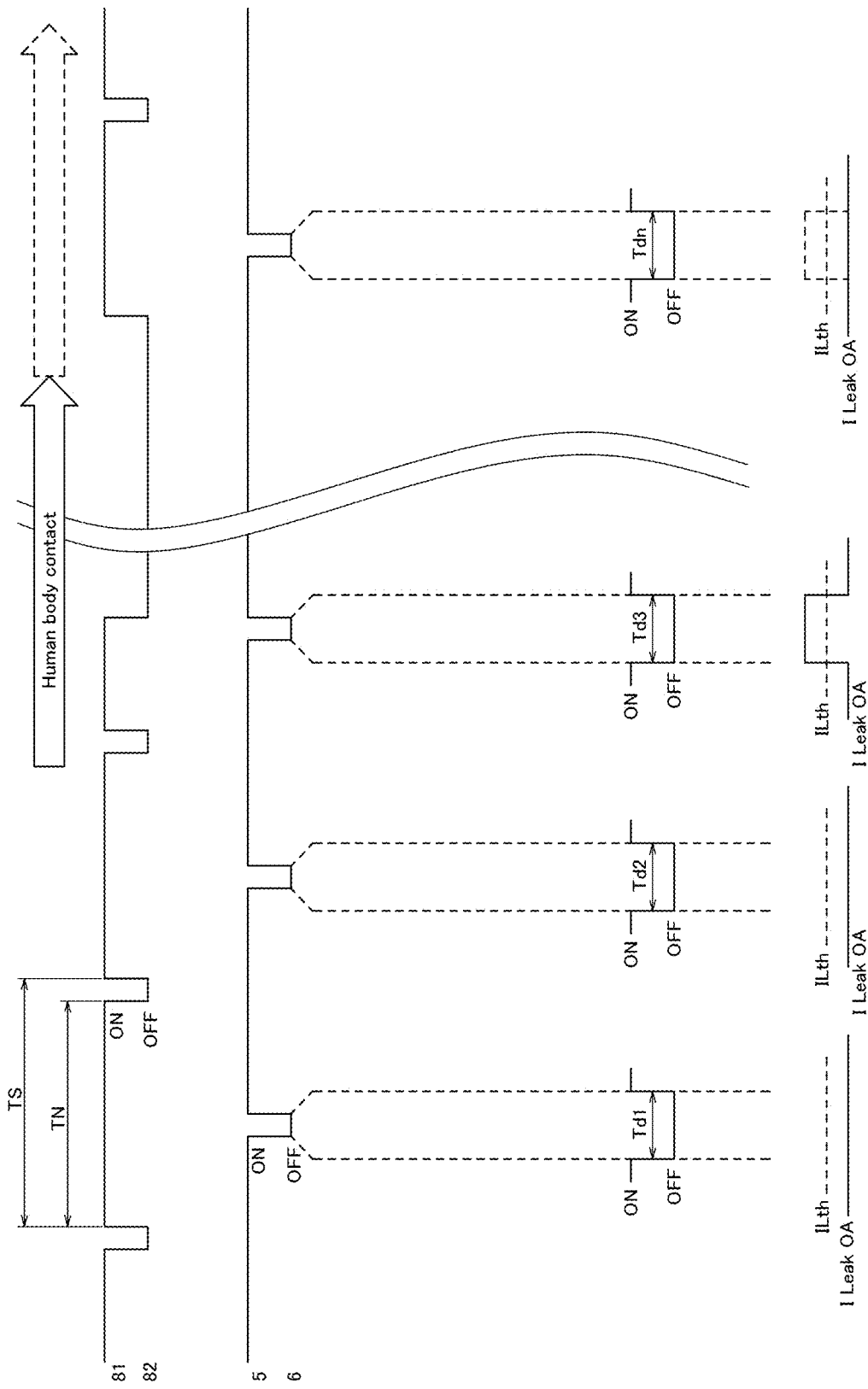
FIG. 4 describes an alternative example of leakage detection in a vehicle power supply device according to an embodiment of the present technology.
Figure 5:
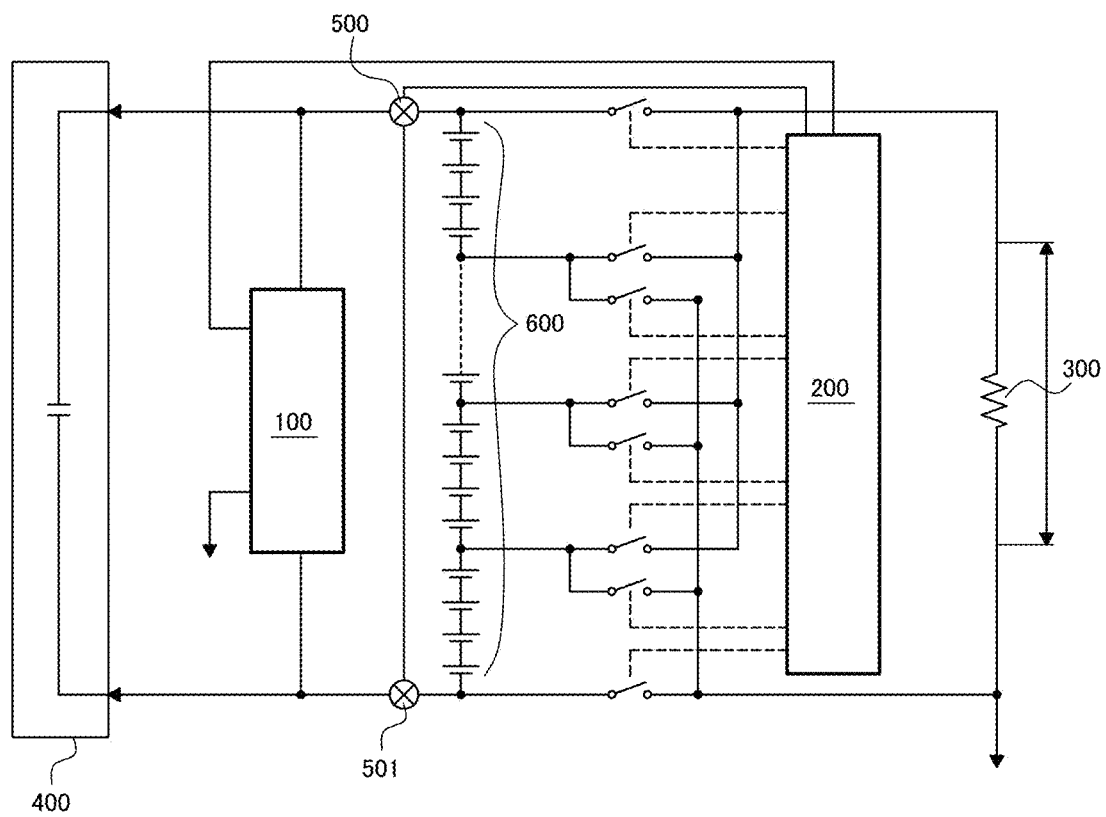
FIG. 5 is a block diagram that schematically illustrates the configuration of a conventional high-voltage power supply.
Figure 6:
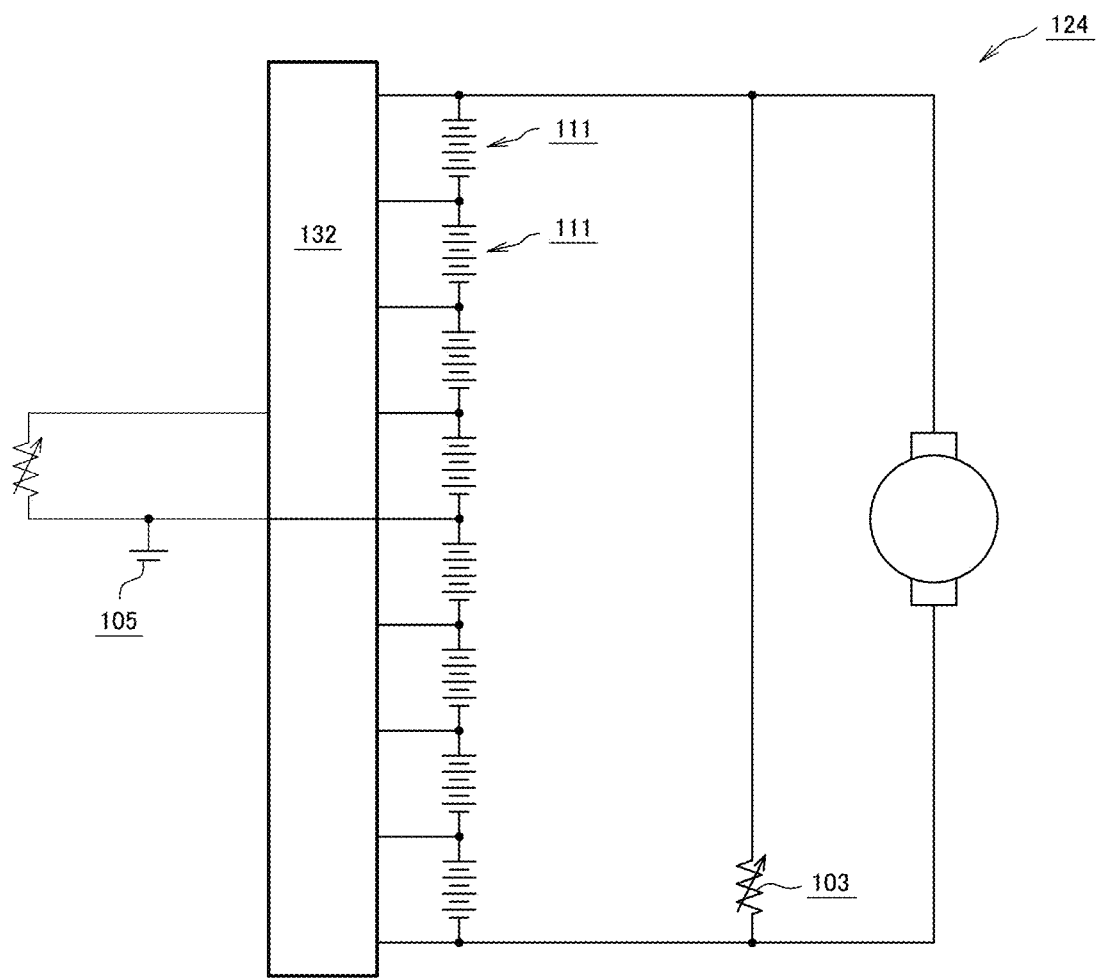
FIG. 6 is a block diagram that schematically illustrates the configuration of a conventional high-voltage power supply.

The operation of the interrupting means 8 and the power leakage detection means 9 will be described below with reference to FIGS. 1, 3, and 4. The upper portions of FIGS. 3 and 4 illustrate switching the first interrupting switch 81 and the second interrupting switch 82 of the interrupting means 8 ON and OFF in a time sequence. The middle portions of FIGS. 3 and 4 illustrate switching the first switching means 5 and the second switching means 6 ON or OFF in a time sequence. The lower portions of FIGS. 3 and 4 illustrate the relationship between a power leakage detection value ILeak that is detected by the power leakage detection means 9 and a reference value ILeak of a leakage current that is stored in advance by the control means 7. Out of the current that flows between the terminal T1 and a ground terminal T3 and the current that flows between the terminal T2 and the ground terminal T3, the power leakage detection means 9 is configured to output the greater power leakage detection value ILeak from the terminal T0 to the control means 7.

In the period in which the first switching means 5 and the second switching means 6 are OFF, the terminal T1 and the terminal T2 are floating relative to the vehicle body, and the power leakage detection value thus becomes 0 ampere. However, when a human body touches the positive pole side of the second power storage element group 3, that is to say the terminal T1 side, a leakage current is detected between the terminal T2 and the ground terminal T3, because the resistance value of a human body is about 5 KΩ.

As illustrated in FIG. 3, when a human body is not in contact with a high-voltage section, the power leakage detection value ILeak of the power leakage detection means 9, in dead time periods Td1 and Td2 in which the first switching means 5 and the second switching means 6 are OFF, is 0 ampere. However, when a human body touches the high-voltage section during the period in which the first switching means 5 and the second switching means 6 are ON, the power leakage detection value ILeak of the power leakage detection means 9, in a dead time period Td3 in which the first switching means 5 and the second switching means 6 are OFF, becomes greater than 0 ampere.

The control means 7 acquires the power detection value ILeak via the terminal TO of the power leakage detection means 9. When it has been detected that the acquired ILeak is equal to or greater than a prescribed value ILth, it is determined that a power leakage caused by human body contact or equipment abnormality has occurred. Then, as illustrated in FIGS. 3 and 4, the first interrupting switch 81 and the second interrupting switch 82 of the interrupting means 8 are turned OFF for a prescribed period.

As illustrated in FIG. 3, the control means 7 may subsequently maintain the interrupting means 8 in the OFF state without prescribing a period. Meanwhile, a leakage current may temporarily flow in the vehicle not only when a human body touches the high-voltage section, but also in the event of a leak in an on-board electronic component, a malfunction of an insulating portion, or due to vibrations or the like during travel. If the supply of power to the high-voltage load were to be completely stopped by the operation of the control means 7 in such cases, the vehicle may lose functionality of various parts during travel, which could be dangerous.

Thus, as illustrated in FIG. 4, the control means 7 may be configured so that, when the power leakage detection value ILeak of the power leakage detection means 9 is equal to or greater than the prescribed current value ILth, the control means repeats an operation of holding the first interrupting switch 81 and the second interrupting switch 82 of the interrupting means 8 in the OFF state for a prescribed period, and then turning the first interrupting switch 81 and the second interrupting switch 82 ON again.

Because of this, supply of power to the high-voltage load 30 from the high-voltage power supply that is constituted by the first power storage element group 2 and the second power storage element group 3 is resumed even if a temporary leakage current occurs due to a malfunction of any power supply device parts or the like of the vehicle body, which makes it possible to restore the vehicle functionality and maintain travel safety. In addition, by setting the state in which the interrupting means 8 is OFF to, for example, 0.5 seconds or more, fatal effects on the human body can be eliminated even in a case where the leakage current is not due to a malfunction of the vehicle but an actual electric shock to the human body.

In case the power leakage detection value ILeak of the power leakage detection means 100 in the dead time period Tdn exceeds the ILth when the first interrupting switch 81 and the second interrupting switch 82 are turned ON again, the control means 7 determines that a human body is still in contact with the high-voltage circuit, and turns the first interrupting switch 81 and the second interrupting switch 82 OFF again.

In case the power leakage detection value ILeak of the power leakage detection means 9 in the dead time period Tdn is less than the ILth when the first interrupting switch 81 and the second interrupting switch 82 are turned ON again, the control means 7 determines that a human body is not in contact with the high-voltage circuit, and maintains the ON state of the first interrupting switch 81 and the second interrupting switch 82 to resume the supply of power to the high-voltage load device 30.

The high-voltage power supply that is constituted by the first power storage element group 2 and the second power storage element group 3 is interrupted by the interrupting means 8, and therefore, no high-voltage current will flow through the human body and an electric shock can be prevented. Furthermore, the vehicle power supply device 1 is surrounded by a housing that is not illustrated here, whereby a human body can be prevented from touching the interior of the vehicle power supply device 1 and receiving an electric shock.

The current interrupting process of the control means 7 can be configured, according to the respective operation states of the low-voltage load 20 and the high-voltage load 30, to be at least either one or both of prohibiting connection of both the first interrupting switch 81 and the second interrupting switch 82 of the interrupting means 8, and prohibiting connection of both the first switching means 5 and the second switching means 6.

EXAMPLES

Below is a specific description of the configuration and operation of the vehicle power supply device 1 that supplies power to a low-voltage load 20 of 12 V and a high-voltage load 30 of 300 V that are provided to a vehicle. The low-voltage load 20 to which power is supplied is, for example, an electric power steering device or a wireless door locking device. The high-voltage load 30 to which power is supplied is, for example, a vehicle motor.

In the present example, the same type of lithium-ion batteries 11 having a charging voltage of 3 V are used for both the first power storage element group 2 and the second power storage element group 3. The first power storage element group 2 includes five lithium-ion batteries that are connected in series. The second power storage element group 3 includes 95 lithium-ion batteries that are connected in series. The first power storage element group 2 has a direct current with a maximum voltage of 15 V. Combining the first power storage element group 2 and the second power storage element group 3 results in a DC power supply with a maximum voltage greater than 300 V.

The first power storage element group 2 supplies power to both the low-voltage load 20 and the high-voltage load 30, and therefore often has a lower charging rate than the second power storage element group 3. Therefore, the active balancer 4 operates the switching elements 41, 42 in the balancing circuit at different timings and cycles, performing the same operation as a step-up/step-down chopper, whereby the stats of charge of the power storage element groups are maintained equal. As an alternative example, the active balancer 4 may perform an operation to transfer the charge of the batteries of the second power storage element group 3 to the batteries of the first power storage element group 2. Such an active balancer 4 includes a plurality of transistors, a plurality of diodes, and a switch, and performs charging by generating a current from a primary-side transistor in which a plurality of transistors are connected in series to a secondary-side transistor that is connected to the power storage element group in which the charging amount is low.

In the present example, switching elements that are compatible with the maximum voltage of 15 V output by the first power storage element group 2 may be applied as the first switching means 5 and the second switching means 6. Therefore, there is no need to apply expensive, high-voltage compatible switches as the first switching means 5 and the second switching means 6, and transistors such as MOSFETs or the like may be employed.

Semiconductor switches or the like that can withstand 300 V may be applied as the first interrupting switch 81 and the second interrupting switch 82 of the interrupting means 8.

The ground terminal T3 of the power leakage detection means 9 is grounded by being connected to the vehicle body. During a period in which both the first switching means 5 and the second switching means 6 are OFF, the each of the positive pole-side terminal T1 and the negative pole-side terminal T2 of the power leakage detection means 9 are floating relative to the vehicle body, and a reference potential is maintained. Therefore, the detected current value of the power leakage detection means 9 is normally 0 ampere. However, when a human body touches the high-voltage section during a period in which the first switching means 5 and the second switching means 6 are ON, the power leakage detection value ILeak of the power leakage detection means 9 in a dead time period Td3 in which the first switching means 5 and the second switching means 6 are OFF becomes greater than 0 ampere.

The control means 7 acquires the leakage current ILeak that is output from the power leakage detection means 9, and compares said ILeak with a reference current value ILth. The safest reference current value ILth is 0 ampere. However, it is generally considered that when the current value is 30 milliampere, an electric shock time of 0.1 seconds or less will not cause any fatal reaction in the human body. In the present example, from a realistic perspective of electric shock prevention, the reference current value ILth is set so that the maximum value of the product of the electric shock current and the electric shock time becomes 0.003 ampere-seconds.

In the vehicle power supply device 1 according to the present example, it can be hypothesized from the voltage value 300 volts of the high-voltage power supply and the human body resistance of 5 KΩ that the maximum electric shock current is 60 milliampere. Accordingly, an electric shock time that will not cause any harm to the human body is estimated to be 0.05 seconds or less. Thus, in the present example, the maximum value of the period TN in which the first interrupting switch 81 and the second interrupting switch 82 are ON is set, with a sufficient margin, to a small value of 0.001 seconds.

An interruption command that is output by the control means 7 may be a process that prohibits connection of both the first interrupting switch 81 and the second interrupting switch 82 of the interrupting means 8. By prohibiting connection of the interrupting means 8, the supply of power to the high-voltage load 30 is stopped, and an electric shock is prevented. Alternatively, the current interruption command that is output by the electric shock prevention unit may also be a process that prohibits connection of both the first switching means 5 and the second switching means 6. Further, both the process of prohibiting connection of the interrupting means 8 and the process of prohibiting connection of both the first switching means 5 and the second switching means 6 may be performed simultaneously.

In case the current interruption command of the control means 7 is set to turn the first interrupting switch 81 and the second interrupting switch 82 of the interrupting means 8 OFF for a prescribed period, a capacitor (not illustrated here) having a desired capacity may be provided in parallel with the high-voltage load 30, so that it is possible to retain the voltage that is supplied to the high-voltage load 30 even during this stopping period.

When the control means 7 according to the present example detects that the acquired ILeak is equal to or more than the prescribed value ILth, the OFF state of the first interrupting switch 81 and the second interrupting switch 82 of the interrupting means 8 may be maintained, as illustrated in FIG. 3. Alternatively, in order to avoid danger to the human body due to an electric shock current while not stopping the power supply to the high-voltage load due to a leakage current detection caused by the vehicle, the control means 7 may, as illustrated in FIG. 4, when the power leakage detection value ILeak of the power leakage detection means 9 is equal to or more than the prescribed current value ILth, repeat an operation of holding the interrupting means in the OFF state for, for example, a prescribed time of 0.5 seconds or longer, and then turning the interrupting means 8 ON again.

The configuration of the high-voltage power supply described in the present example may be modified, as appropriate. For example, the number of the power storage elements that constitute the first power storage element group 2 and the second power storage element group 3 may be modified, as appropriate, depending on the type of loads to which power is to be supplied. In addition, the configuration of the active balancer 4 may also be modified, as appropriate, along with the configuration of the first power storage element group 2 and the second power storage element group 3.

INDUSTRIAL APPLICABILITY

The vehicle power supply device according to the present technology may be installed in any industrial machinery other than vehicles. When applied to something other than vehicles, it is necessary to ground the ground terminal of the power leakage detection means 9 at a position that constitutes a reference potential.

DESCRIPTION OF THE REFERENCE NUMERALS

1 Vehicle power supply device
2 First power storage element group
3 Second power storage element group
4 Active balancer
5 First switching means
6 Second switching means
7 Control means
8 Interrupting means
9 Power leakage detection means
20 Low-voltage load
21 Capacitor
30 High-voltage load

The invention claimed is:

1. A vehicle power supply device that supplies power to a low-voltage load and a high-voltage load that is driven by a higher voltage than that of the low-voltage load, the vehicle power supply device comprising:

a first power storage element group in which a first plurality of power storage elements are connected in series such that a DC power supply having a prescribed voltage is obtained;

a second power storage element group that is constituted by a second plurality of power storage elements that are connected in series, the second power storage element group being connected in series to a positive pole side of the first power storage element group and constituting a high-voltage DC power supply by being combined with the first power storage element group; an active balancer that is positioned between the first power storage element group and the second power storage element group; a first switch and a second switch that are provided corresponding to an output terminal that supplies a low voltage from the first power storage element group;

a third switch capable of interrupting power from the high-voltage DC power supply;

controller capable of performing control to:

obtain a prescribed low voltage by controlling the first switch and the second switch;

substantially equalize the capacities of all the power storage elements of the first, and second, plurality of power storage elements by controlling the active balancer; and switch the third switch; and power leakage detector capable of:

detecting a leakage current between the high-voltage DC power supply and a ground potential;

and transmitting a signal to the controller, wherein the controller is further capable of: determining the signal transmitted from the power leakage detector during a dead time period in which the first switch and the second switch are OFF; and interrupting power supplied to either one or both of the low-voltage load and the high-voltage load for a prescribed period in case the leakage current has reached a prescribed level.

2. The vehicle power supply device according to claim 1, wherein the active balancer is connected to three points that are the negative pole side of the first power storage element group, the positive pole side of the second power storage element group, and an output terminal that is provided between the first power storage element group and the second power storage element group.

3. The vehicle power supply device according to claim 1, wherein, the controller is further capable of fixing the third switch in an OFF state when the leakage current has reached the prescribed level.

4. The vehicle power supply device according to claim 1, wherein, when the leakage current has reached the prescribed level, the controller is further capable of repeating an operation of holding the third switch in the OFF state for a prescribed period, and then turning the third switch ON again.

5. The vehicle power supply device according to claim 1, wherein the controller is further capable of controlling the first, and the second, switch so that the maximum value of a product of a period in which the first, and the second, switch and the low-voltage load are connected, and a power leakage detection value of the power leakage detector becomes 0.003 ampere×1 second or less.

6. The vehicle power supply device according to claim 1, wherein the controller is further capable of prohibiting connection of the first switch and the second switch when the leakage current has reached the prescribed level.

7. The vehicle power supply device according to claim 1, wherein a current value that constitutes a reference of the leakage current is 0 ampere, and wherein the controller is further capable of interrupting power supplied to either one or both of the low-voltage load and the high-voltage load in case the leakage current is greater than 0 ampere.

* * * * *